United States Patent [19]

Chamran et al.

[11] Patent Number: 4,644,323
[45] Date of Patent: Feb. 17, 1987

[54] ANALOG-TO-DIGITAL CONVERTER HAVING PROGRAMMABLE DYNAMIC RANGE

[75] Inventors: Morteza M. Chamran, Elmhurst, Ill.; Larkin B. Scott, Fort Worth, Tex.; Paul B. Williams, Lombard, Ill.

[73] Assignee: The Perkin-Elmer Corporation, Norwalk, Conn.

[21] Appl. No.: 181,528

[22] Filed: Aug. 26, 1980

[51] Int. Cl.[4] ............................................. H03M 1/52
[52] U.S. Cl. ..................... 340/347 NT; 340/347 AD; 340/347 M; 340/347 CC; 324/99 D
[58] Field of Search .... 340/347 M, 347 NT, 347 AD, 340/347 CC; 324/99 D

[56] References Cited

U.S. PATENT DOCUMENTS

| | | | |
|---|---|---|---|
| 3,267,458 | 8/1966 | Anderson et al. | 340/347 NT |
| 3,322,942 | 5/1967 | Gerard et al. | 364/832 X |
| 3,582,947 | 6/1971 | Harrison | 340/347 NT |
| 3,662,376 | 5/1972 | Furukawa et al. | 340/347 AD |
| 3,900,844 | 8/1975 | Wald | 340/347 AD X |
| 3,987,435 | 10/1976 | Ikeda | 340/347 NT |
| 4,090,192 | 5/1978 | Shuttleworth | 340/347 NT |
| 4,204,197 | 5/1980 | Loshbough et al. | 364/466 X |

OTHER PUBLICATIONS

Jessen, Digital Voltmeter Gets Speedy, Accurate Results, Electronic Design, 7 Jun. 1980, pp. 149-156.
Fullagar et al, Interfacing Data Converters and Microprocessors, Electronics, 9 Dec. 1976, pp. 81-89.
Hurley, Transistor Logic Circuits, John Wiley & Sons, Inc., 1961, pp. 323-331.
Bernstein, What to Look for in Analog Input/Output Boards, Electronics, 19 Jan. 1978, pp. 113-119.
Strong, Product Development Profile: Rough Life of Digital Multimeter Electronics, 23 Jun. 1977, pp. 107-112.
Schmid, Electronic Analog/Digital Conversions, Van Nostrand Reinhold Co., 1970, pp. 204-209.

Primary Examiner—T. J. Sloyan
Attorney, Agent, or Firm—Edwin T. Grimes; Thomas P. Murphy; Francis L. Masselle

[57] ABSTRACT

A programmable timer controls the duration of integration with respect to time of an unknown analog signal in accordance with a programmable time period established by a microprocessor. A switching logic successively transfers an analog signal and a voltage reference signal to an integrator under logic control actuated by the programmable timer. A comparator monitors the value of the integration of the reference voltage in order to control the time-out results of an event counter initiated simultaneously with input to the integrator of the reference voltage, for providing a digital count output signal to the microprocessor.

18 Claims, 4 Drawing Figures

ANALOG-TO-DIGITAL CONVERTER HAVING PROGRAMMABLE DYNAMIC RANGE

BACKGROUND OF THE INVENTION

The invention relates to a method and apparatus for analog-to-digital conversion, and more particularly relates to a dual-slope conversion technique in which the duration of integration of an analog signal to be converted is programmable in response to the results of the digital conversion of a previous conversion operation.

In many analytical instrumentations, signal information is retrieved in analog form and must be converted to a digital form for data handling and display by a microprocessor. There are several methods and apparatus for converting an analog signal to a digital signal, with different methods having different advantages and disadvantages. The most common techniques in the art are: dual-slope integration, successive approximations, and voltage-to-frequency conversion.

The dual-slope technique which is basically a ratiometric measurement, has good accuracy, stability and ability to integrate noise. However, the dual-slope technique is relatively slow and does not have sufficient dynamic range for today's technological demands.

Therefore, it is an object of the present invention to expand the dynamic range of a dual-slope method of analog-to-digital conversion without sacrificing accuracy, stability, or noise performance.

It is another object of the present invention to provide a standard, low cost, analog-to-digital converter in conjunction with a microcomputer, having a programmable dynamic range.

It is yet another object of the present invention to provide a novel analog-to-digital converter which is compatible with a microprocessor, but which does not monopolize the functioning of the microprocessor.

SUMMARY OF THE INVENTION

These and other objects of the invention are achieved by integrating an analog signal to be converted, over a preset period of time for generating an integrated signal. A reference voltage is integrated with respect to the integrated signal, and the time period of integration is timed for generating a digital output signal. A value for the preset period of time is determined in view of the magnitude of the digital output signal, for use in a subsequent conversion operation.

DESCRIPTION OF THE PREFERRED EMBODIMENT

The conversion of an analog signal to a digital signal using a dual-slope integration technique, is well known. Briefly, the unknown analog voltage is integrated for a fixed period of time resulting in the generation of an integrated signal having a certain amplitude. This amplitude will vary depending on the amplitude of the analog signal. A known voltage is also integrated over an unknown period of time until its output integral equals the output integral resulting from the integration of the analog signal. The unknown period of time is measured digitally to provide a digital signal representative of the magnitude of the unknown analog signal.

For example, the output amplitude of the integrated voltage of an integrator having an RC integration constant in which an unknown voltage $V_x$ is integrated over a known time period $T_1$ can be represented as follows:

$$V_0(T_1) = -1/RC \int_0^{T_1} V_x dT$$

$$V_0(T_1) = -V_x T_1/RC$$

Also, the output amplitude of the integrated voltage of the integration of a known reference voltage $V_r$ during an unknown time $T_2$ can be represented as follows:

$$V_0(T_2) = 1/RC \int_0^{T_2} V_R dT$$

$$V_0(T_2) = -V_R T_2/RC$$

Thus, letting the integrated voltages of the two integrations be equal, i.e., the area under the curve for the analog signal $V_x$ for a known period of time $T_1$ be equal to the area under the curve of a known reference voltage $V_R$ at some unknown time $T_2$, yields the following:

$$V_0(T_2) = V_0(T_1)$$

Then, $$V_x T_1/RC = V_r T_2/RC$$

$$V_x/V_r = T_2/T_1,$$

which is a ratiometric equation with known factors $V_r$ and $T_1$. Therefore the unknown factor $T_2$ is measured digitally for determining the unknown analog signal $V_x$. $T_2$ may be determined by a number of counts accumulated in a digital counter which is initiated during integration of the reference voltage.

Figure 1:
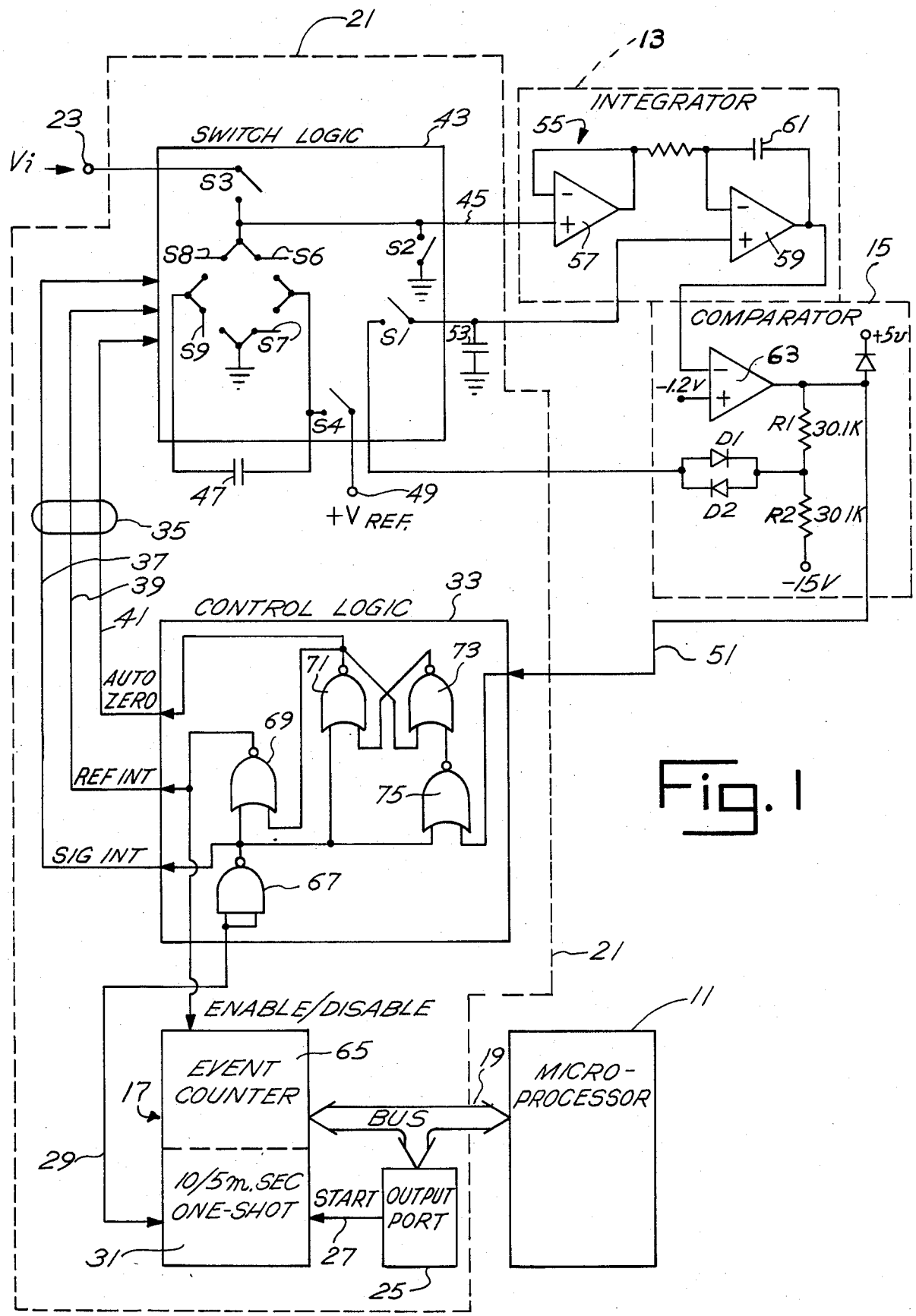
FIG. 1 is an electrical schematic and block diagram of a preferred embodiment of the present invention.

Referring to FIG. 1, the analog-to-digital (A-to-D) conversion of the preferred embodiment is performed via such a dual-slope technique by a microprocessor 11 which merely commands the conversion and receives the final result thereof, in a fashion to free the microprocessor from being slaved to the A-to-D conversion operation. An integrator 13 is utilized for performing the integration function of the dual-slope operation, and a comparator 15 is utilized for monitoring the integrated amplitudes of the two integrations for indicating an amplitude comparison in order to time-out a digital timer circuit 17.

Microprocessor 11 initiates the A-to-D conversion by communication along a conductor bus 19 with a control circuit 21. Control circuit 21 receives an unknown analog signal $V_i$ appearing at a circuit node 23 and controls transmission of the analog signal to integrator 13 for a predetermined time period; after which, control circuit 21 transmits a reference voltage $V_{ref}$ to integrator 13 for integration to a predetermined integrated amplitude. Control circuit 21 monitors the time period of the integration of the reference voltage $V_{ref}$ in order to generate an output signal representative of such time period, for presentation on bus 19 for receipt by microprocessor 11.

Microprocessor 11 initiates the conversion by generating an address/command word via bus 19 to an output port 25 for generating a START pulse of 50 microseconds duration along a conductor 27. Timer circuit 17 responds to the START pulse by generating an output signal along a conductor 29 having a logic LOW value for a time $T_1$ for controlling the duration of integration of the input signal $V_i$. Timer 17 includes a one-shot multivibrator circuit 31 for providing either a 10 millisecond or 5 millisecond output pulse along conductor 29.

A control logic 33 responds to the output pulse from one-shot 31 and consequently generates a digital control signal along a conductor bus 35 which is comprised of three conductors 37, 39, 41. Conductors 37–41 are connected between control logic 33 and a switch logic 43 for successively placing switch logic 43 in each of three separate switching states. A first state of switch logic 43 transmits the unknown analog signal $V_i$ along a conductor 45 to integrator 13; a second state of switch logic 43 passes the reference voltage $V_{ref}$ in a reverse polarity mode to integrator 13; and the third state of switch logic 43 serves to initialize the integrator and comparator for a subsequent conversion operation.

Switch logic 43 may be constructed from an Intersil chip 8053 and includes a plurality of switches S1, S2, S3, S4, S6, S7, S8, and S9 connected as shown. The leading edge of the one-shot pulse on conductor 29 causes conductor 37 to go HIGH, placing switch logic 43 in its first state for passing the unknown analog signal $V_i$ to integrator 13. During this first state of switch logic 43, switches S3, S4, and S9 are closed and switches S1, S2, S6, S7 and S8 are open. The switches will remain in this first state for the period of time in which the signal (SIG INT) appearing on conductor 37 is HIGH, which is for a time $T_1$ determined by one-shot 31. With switch S3 closed, the analog voltage $V_i$ travels to the input of integrator 13. The closing of switches S4 and S9 serves to charge a reference capacitor 47 to the voltage $V_{ref}$ by connecting capacitor 47 between a voltage source 49 and ground.

Control logic 33 responds to the trailing edge of the timed pulse on conductor 29 for switching the digital signal appearing on bus 35, making the signal SIG INT on conductor 37 LOW and making the signal (REF INT) on lead 39 HIGH, causing switch logic 43 to enter its second state. The second state of switch logic 43 stops transmission of the analog signal $V_i$ to the integrator and, instead, transmits the reference signal $V_{ref}$ stored on capacitor 47 to the integrator. Switch logic 43 responds to the REF INT signal going HIGH by opening switches S3, S4, and S9 and closing switches S7 and S8; switches S1, S2 and S6 remain open. Closing of switches S7 and S8 transmits the reference voltage in opposite polarity to the input of integrator 13 by connecting the positive side of capacitor 47 to ground and connecting the negative side of capacitor 47 to conductor 45.

Figure 2:
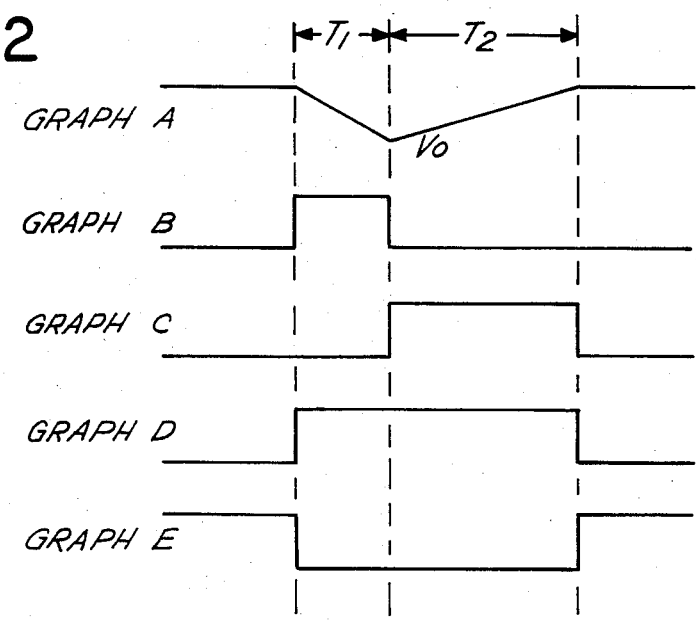
FIG. 2 is a graphical representation of electrical waveforms of the embodiment of FIG 1.

Referring to FIG. 2, GRAPH A illustrates the output of integrator 13 over time periods $T_1$ and $T_2$. During time period $T_1$, the unknown analog signal $V_i$ is integrated reaching an integrated voltage of $V_0$. During time period $T_2$, reference voltage $V_{ref}$ serves to drive the integrated voltage back toward the initial voltage level. GRAPHS B and C illustrate signals SIG INT and REF INT, respectively, with respect to time periods $T_1$ and $T_2$.

When the integrated output voltage of integrator 13 reaches a voltage amplitude close to initial volts, comparator 15 switches its output voltage which the comparator generates along a conductor 51. GRAPH D of FIG. 2 illustrates the comparator output voltage in relation to the integrator output of GRAPH A. Control logic 33 responds to the trailing edge of the output signal of the comparator on conductor 51 as a completion signal for changing the digital signal appearing along bus 35, SIG INT and REF INT signals go low and the signal (AUTO ZERO) appearing on conductor 41 goes HIGH.

Switch logic 43 enters its third state by responding to the AUTO ZERO signal going HIGH (GRAPH E, FIG. 2), in which switch S8 is opened and switches S1, S2, S4 and S9 are closed; switches S3, S6, S7 and S8 remain open. Closing of switch S2 shorts the input of integrator 13 to ground. The closing of switch S1 forms a closed circuit loop around the integrator 13 and comparator 15 in order to charge a capacitor 53 to a voltage at which the integrator output does not change with respect to time, serving to eliminate the effect of any offset voltage change caused by the integrator and comparator, as will be understood. A pair of diodes D1 and D2, and a pair of resistors R1 and R2 are connected in the loop circuit as shown, for providing a proper charging signal to capacitor 53. Also, switches S4 and S9 are closed permitting reference capacitor 47 to be recharged.

Integrator 13 includes an impedance buffer 55 formed of an operational amplifier 57 for buffering the input signal along conductor 45 to integrator 13. Integrator 13 is formed from an operational amplifier 59 having a feedback capacitor 61 connecting the output of operational amplifier 59 to its inverting input. The non-inverting input of op amp 59 is connected to ground via capacitor 53.

Comparator 15 includes an operational amplifier 63 having its inverting input connected to the output of integrator operational amplifier 59, and having its non-inverting input connected to −1.2 volts. When the input to operational amplifier 63 approaches −1.2 volts operational amplifier 63 switches its output voltage to a LOW output state as shown in GRAPH D of FIG. 2. Both integrator 13 and comparator 15 may be formed from an Intersil 8068 integrated circuit chip.

In order to time the time period $T_2$, timer circuit 17 receives the REF INT signal, the leading edge of which indicates initiation of integration of the reference voltage $V_{ref}$ and the trailing edge of which indicates the completion of integration of the reference voltage. Timer circuit 17 includes an event counter 65 which is enabled by the leading edge of the REF INT signal for counting down from a preset number until the REF INT signal goes LOW, which occurs when the comparator switches its output voltage to a LOW output state as shown in Graph D of FIG. 2.

Microprocessor 11 is able to address event counter 65 for reading the count output. Since the count output will be indicative of a digital value proportional to the amplitude of $V_i$, the microprocessor may utilize the count output signal in order to transform the count output to its proper proportional value using the above cited equation $V_i/V_{ref}=T_2/T_1$.

Microprocessor 11 monitors the value of $V_i$ for determining whether the value of $V_i$ exceeds a certain voltage level, for example, 2 volts. The microprocessor decreases sample time $T_1$ from 10 milliseconds to 5 milliseconds when $V_i$ exceeds the 2 volt threshold. That is, one-shot 31 is programmable by microprocessor 11 along bus 19 for selecting either a 10 millisecond or a 5 millisecond duration output pulse along conductor 29. The one-shot may be formed from a programmable counter which is counted down from a code value stored by the microprocessor in the one-shot. When $T_1$ is programmed for 5 milliseconds, the microprocessor will multiply the contents of event counter 65 by two (2) in order to keep the ratiometric proportion accurate. Thus, the dynamic range of the A-to-D converter may be increased according to microprocessor command.

Control logic 33 is formed from a plurality of logic gates including NAND gate 67 and NOR gates 69, 71, 73 and 75, connected as shown. NAND gate 67 serves to invert the one-shot signal along conductor 29 for presentation as SIG INT signal along conductor 37. NOR gate 69 generates the REF INT signal from the output of NAND gate 67 together with the output state of a flip flop formed from NOR gates 71, 73. The flip flop formed from NOR gates 71, 73 generates the AUTO ZERO signal according to the output of comparator 15 along conductor 51 via logic gate 75. As will suggest itself other logic configurations may be utilized for control logic 33.

Figure 3B:
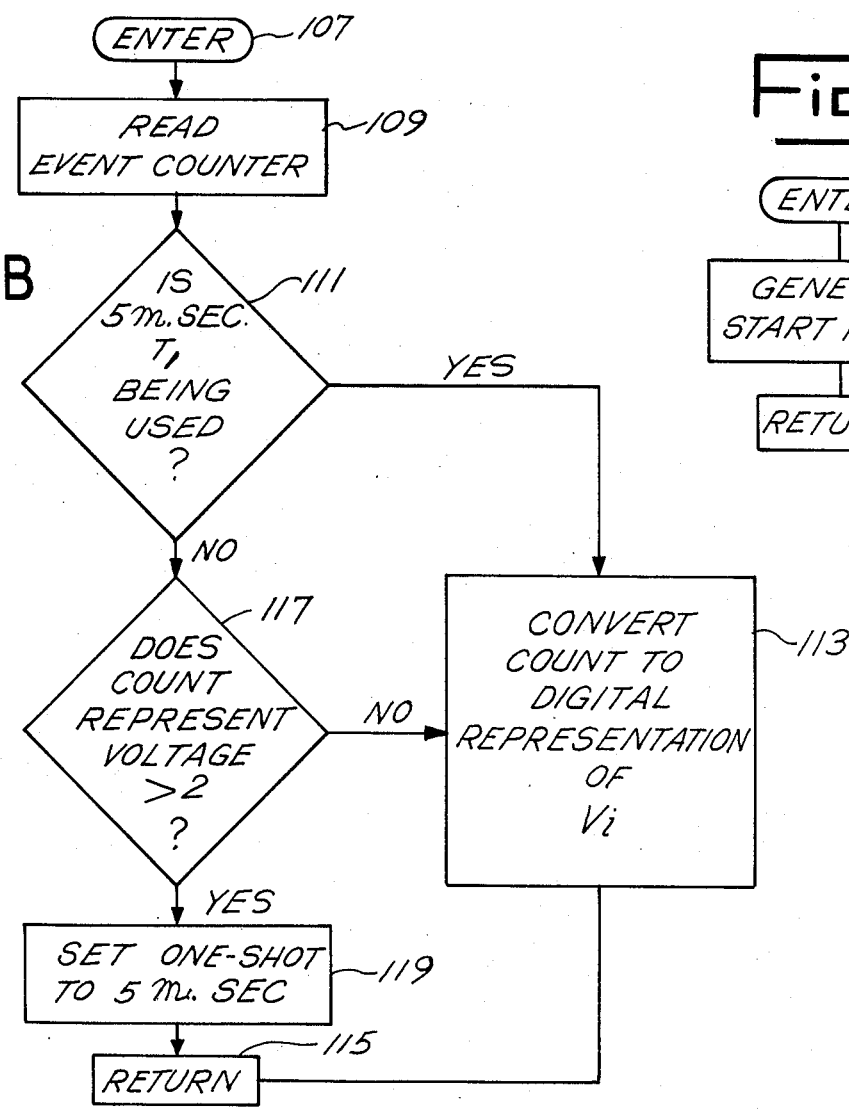
FIGS. 3A and 3B are Flow diagrams of the flow of operation of a microprocessor of the embodiment of FIG. 1.
Figure 3A:
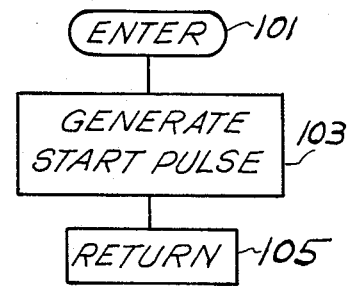

FIGS. 3A and 3B illustrate the flow diagram of microprocessor control for performing the A-to-D conversion. The microprocessor commands the conversion of the analog signal during the flow of FIG. 3A and receives and processes the final result thereof for further use in the main program during the flow of FIG. 3B. This frees the microprocessor from being slaved to the A-to-D conversion operation.

As shown in FIG. 3A, the microprocessor performs a plurality of steps 101, 103 and 105 in order to command digital conversion of the analog signal $V_i$. The microprocessor enters the routine of FIG. 3A at step 101 whenever the main program requires the conversion operation to be performed. Upon entering the routine of FIG. 3A the microprocessor generates an address/command word via bus 19 to output port 25 for generating a START pulse (step 103). Thereafter via step 105, the microprocessor returns to the main program for executing further instructions while the digital signal is being generated by control circuit 21.

After the analog signal has been converted to digital form by control circuit 21, the microprocessor enters the routine of FIG. 3B in order to receive a digital count signal from event counter 65. The updating time for a full scale conversion is set at 66.6 milliseconds, that is, the A/D cycle begins with a sample time $T_1$ for ten milliseconds, followed by the reference integration time $T_2$ of up to 52 milliseconds, and 3.5 milliseconds is needed for the autozero phase of the system wherein the zero off-set voltage of the integrator and comparator is nulled automatically.

The embodiment described is preferably utilized in a spectrophotometer system in which the analog signal $V_i$ may be, for example, a reading of transmittance. The maximum input voltage to the A-to-D converter is established at four volts. The voltage then for 100% transmittance is set for two volts which generates 52,000 binary counts in counter 65. Since the spectrophotometer is required to operate up to 200% transmittance, 200% transmittance is set to correspond to four volts.

Thus, after at least a delay of 66.6 milliseconds the microcomputer flows through a plurality of steps 107 through 119 of FIG. 3B for receiving a digital representation of the analog signal $V_i$.

Upon entering step 107, the microprocessor reads the count signal stored in event counter 65, step 109. Prior to converting the count signal to a digital representation of $V_i$ using the RC ratiometric proportionality as discussed above, the microprocessor determines whether one-shot 31 has been programmed for a five millisecond output pulse, $T_1$, at step 111. If a five millisecond $T_1$ is being used, the count signal is converted to a digital representation of $V_i$ at step 113 and control is returned to the main program via step 115.

However, if it is determined at step 111 that a 10 millisecond $T_1$ is being utilized, the microprocessor determines whether the received count signal is representative of a voltage greater than two volts (at step 117). If the count signal is below two volts, the count signal is converted to a digital representation of $V_i$ at step 113 and return is made to the main program. However, if it is determined that the count represents a voltage greater than two volts, the microprocessor generates an address/command word via bus 19 to timer circuit 17 for programming one shot 31 to generate a 5 millisecond output pulse (step 119). Thereafter, return is made to the main program via step 115 for re-initiating the routine of FIG. 3A in order to reconvert the analog signal $V_i$ using the newly programmed time period $T_1$. After reconversion of $V_i$ using the new time period $T_1$, the microprocessor will enter the routine of FIG. 3B for converting the new count signal to a digital representation of $V_i$. During the mathematical conversion at step 113, the count output signal will be multiplied by two as discussed above.

It will be apparent that further extension of range may be made by programming the microprocessor to select from three or more timing periods, instead of being limited to the two periods given by way of example, and to convert the count according to the time period selected.

It will be understood, of course, that the foregoing disclosure relates to a preferred embodiment of the invention and that modifications or alterations may be made therein without departing from the spirit or scope of the invention as set forth in the appended claims.

What is claimed is:

1. An analog-to-digital converter comprising:
   integrator means for integrating an analog signal with respect to time and generating an output signal having an amplitude representative of the integral of the analog signal;
   comparator means for monitoring said output signal of said integrator means for generating a completion signal when said output signal reaches a predetermined amplitude;
   input means for receiving input of an unknown analog signal for integration by said integrator means;
   reference signal means for generating a reference signal having a predetermined amplitude, for integration by said integrator means; and
   control means including programmable timer means for establishing the time of integration of said analog signal to a preset time,
   microprocessor means for initiating said timed cycle;
   said control means being responsive to timer command for passing said analog signal to said integrator means for integration over said preset time and for passing said reference signal to said integrator means for integration and generation of a said completion signal by said comparator means, said control means being also responsive continuously to the completion signal from the comparator on terminating integration of said reference signal, and said timer means timing the integration of said reference signal and generating a digital output signal representative of the time of the timed integration, whereby an analog signal is converted to a digital signal for use by the microprocessor, said microprocessor means arithmetically modifying said digital output signal in accordance with the value of said preset time, and said microprocessor means programming said timer means to said preset time responsive to said digital output signal for subsequent operations.

2. An input module according to claim 1 wherein said control means includes switch means for switching either said analog signal or said reference signal to said integrator means.

3. An input module according to claim 2 wherein said control means is responsive to timer command for actuating said switch means for passing said analog signal to said integrator means, said control means deactuating said switch means after said preset time responsive to said timer means.

4. An input module according to claim 3 wherein said switch means passes said reference signal to said integrator means responsive to said timer means deactuating said switch means from passing said analog signal to said integrator means.

5. An input module according to claim 2 wherein said programmable timer means includes one shot timer means microprocessor programmable for generating one of a plurality of timed signals.

6. An input module according to claim 5 wherein said one timed signal is generated responsive to microprocessor command, said one timed signal controlling actuation of said switch means for controlling input of said analog signal to said integrator means.

7. An input module according to claim 6 wherein termination of said one timed signal deactuates said switch means from transmitting said analog signal to said integrator means and actuates said switch means for transmission of said reference signal through said integrator means.

8. An input module according to claim 7 wherein said programmable timer means includes an event counter; and wherein said completion of said one timed signal actuates said event counter for timing integration of said reference signal, said event counter being responsive to said completion signal for disabling timing of said reference signal integration.

9. An input module according to claim 1 wherein said programmable timer means includes event counter means for timing the integration of said reference signal, said event counter being responsive to a completion signal for discontinuing timing of said reference signal integration.

10. An input module according to claim 1 wherein said reference signal means includes capacitor means for charging to a predetermined voltage level; and wherein said control means includes switch means for simultaneously passing said analog signal to said integrator means and connecting said capacitor means to said voltage source for charging.

11. Apparatus according to claim 1 wherein said integrator means includes an impedance buffer for buffering the input to said integrator means.

12. An input module according to claim 1 wherein said control means includes switch logic means comprising a plurality of switches each of which having an open or closed position responsive to an input signal, said input signal having one state for actuating said plurality of switches for passing said analog signal to said integrator means, and said input signal having a second state for actuating said plurality of switches for passing said reference signal to said integrator means.

13. An input module according to claim 12 wherein said control means includes control logic means responsive to said programmable timer means and said comparator means for generating said input signal to said switch logic means.

14. An input module according to claim 13 wherein said input signal to said switch logic means includes a third state for initializing said integrator means subsequent to integration of said reference signal.

15. An analog-to-digital converter comprising:
integrator means for integrating an analog signal with respect to time and generating an output signal representative of the integral of said analog signal;
comparator means for monitoring said output signal of said integrator means for generating a completion signal when said output signal reaches a predetermined amplitude; and controller means including:
programmable timer means for setting the time of integration by said integrator means to a programmably determined time, said timer setting being responsive to microprocessor command, and for timing the integration of said analog signal;
input means for receiving input of an unknown analog signal for integration by said integrator means;
reference voltage means for generating a reference analog voltage having a predetermined amplitude, for integration by said integrator means;
event counter means for generating a digital output signal representative of the time of the integration of said reference voltage;
control logic and switching logic means for controlling said event counter means and for controlling integration of said analog signal for said time and for initiating integration of said reference voltage and for timing said integration of said reference voltage, said microprocessor command programming said time of said timer means in accordance with the value of said digital output signal.

16. A method of converting an analog signal to a digital signal comprising the steps of:
integrating an analog signal over one of a plurality of preset periods of time resulting in an integrated value;
integrating a reference voltage with respect to said integrated value;
timing the integration of said reference voltage and generating a digital signal representative of the time of said integration;
arithmetically modifying said digital signal in accordance with the value of said preset period of time,
monitoring the time of said integration of said reference voltage and determining a value for said period of time corresponding thereto;

repeating the above steps using said determined value to determine said preset period of time.

17. A method of converting an analog signal to a digital signal according to claim 16 wherein said step of integrating a reference voltage includes the step of comparing the instantaneous integral of said reference voltage to a predetermined value.

18. A method of converting an analog signal to a digital signal according to claim 16 wherein said step of monitoring includes comparing said digital signal with a digital signal indicative of a threshold; and selecting one of two or more periods of time for said period of time, depending on the comparision of said step of comparing.

* * * * *